United States Patent
Yu

(10) Patent No.: US 8,502,268 B2
(45) Date of Patent: Aug. 6, 2013

(54) LDMOS STRUCTURE

(75) Inventor: Rongwei Yu, Chengdu (CN)

(73) Assignee: IPGoal Microelectronics (SiChuan) Co., Ltd., Chengdu, Sichuan Province (CN)

( * ) Notice: Subject to any disclaimer, the term of this patent is extended or adjusted under 35 U.S.C. 154(b) by 55 days.

(21) Appl. No.: 13/207,426

(22) Filed: Aug. 11, 2011

(65) Prior Publication Data

US 2012/0037984 A1   Feb. 16, 2012

(30) Foreign Application Priority Data

Aug. 12, 2010   (CN) .................. 2010 2 0289701 U

(51) Int. Cl.
  *H01L 29/66* (2006.01)
(52) U.S. Cl.
  USPC ............... 257/162; 257/343; 257/E21.373

(58) Field of Classification Search
  None
  See application file for complete search history.

(56) References Cited

U.S. PATENT DOCUMENTS

| 2004/0108549 A1* | 6/2004 | Denison | 257/335 |
| 2011/0115020 A1* | 5/2011 | Cha et al. | 257/343 |

* cited by examiner

*Primary Examiner* — Tan N Tran
*Assistant Examiner* — Scott R Wilson

(57) ABSTRACT

A LDMOS structure includes a gate, a source, a drain and a bulk. The gate includes a polycrystalline silicon layer, the source includes a P-implanted layer, the drain includes the P-implanted layer, a P-well layer, and a deep P-well layer. A bulk terminal is connected through the P-implanted layer, the P-well layer, the deep P-well layer, and a P-type buried layer to the bulk. The LDMOS structure is able to be produced without any extra masking step, and it has compact structure, low on-resistance, and is able to withstand high current and high voltage.

11 Claims, 2 Drawing Sheets

LDMOS STRUCTURE

BACKGROUND OF THE PRESENT INVENTION

1. Field of Invention

The present invention relates to semiconductors, and more particularly to a LDMOS structure which has compact structure, low on-resistance, and is able to withstand high current and high voltage.

2. Description of Related Arts

With the continuous development of the power semiconductor technology and system integration technology, research on power devices has drawn more and more attentions. Because power devices play a crucial role in the size, weight, price, efficiency, performance and reliability of the power semiconductor, new technologies have been applied to the Laterally Diffused Metal Oxide Semiconductor (LDMOS) device to meet market requirements. It is for this reason, the LDMOS structures and its production processes have improved continuously, and various derivative structures of LDMOS are emerging in an endless stream. Therefore, according to requirements in practical applications, it is necessary to provide a kind of LDMOS structure which has compact structure, low on-resistance, and can withstand high current and high voltage.

SUMMARY OF THE PRESENT INVENTION

An object of the present invention is to provide a LDMOS structure which has compact structure, low on-resistance, and is able to withstand high current and high voltage.

Accordingly, in order to accomplish the above objects, the present invention provides a LDMOS structure, which comprises a gate, a source, a drain and a bulk, wherein the gate comprises a polycrystalline silicon layer, the source comprises a P-implanted layer, the drain comprises the P-implanted layer, a P-well layer, and a deep P-well layer, wherein a bulk terminal is connected through the P-implanted layer, the P-well layer, the deep P-well layer, and a P-type buried layer to the bulk.

Preferably, the drain has a plurality of drain regions, the source has a plurality of source regions, the gate has a plurality of gate regions, wherein each source region is surrounded by four drain regions, each drain region is surrounded by four source regions, and each gate region is located between a source region and a drain region.

Preferably, the LDMOS structure further comprises a back gate, wherein the back gate comprises a N-implanted layer, a N-well layer, a deep N-well layer, a N-epitaxial layer, and a N-type buried layer, and has a plurality of back gate regions, wherein each source region is located near a back gate region.

Preferably, the LDMOS structure further comprises a field-oxide layer.

Preferably, the bulk is a P-type bulk, the bulk terminal is a P-type bulk terminal.

Preferably, the LDMOS is a P-channel LDMOS.

Without any extra masking step, the LDMOS structure of the present invention is able to be produced just by using prior art methods. Furthermore, it has compact structure, low on-resistance, and is able to withstand high current and high voltage.

DETAILED DESCRIPTION OF THE PREFERRED EMBODIMENT

Figure 1:
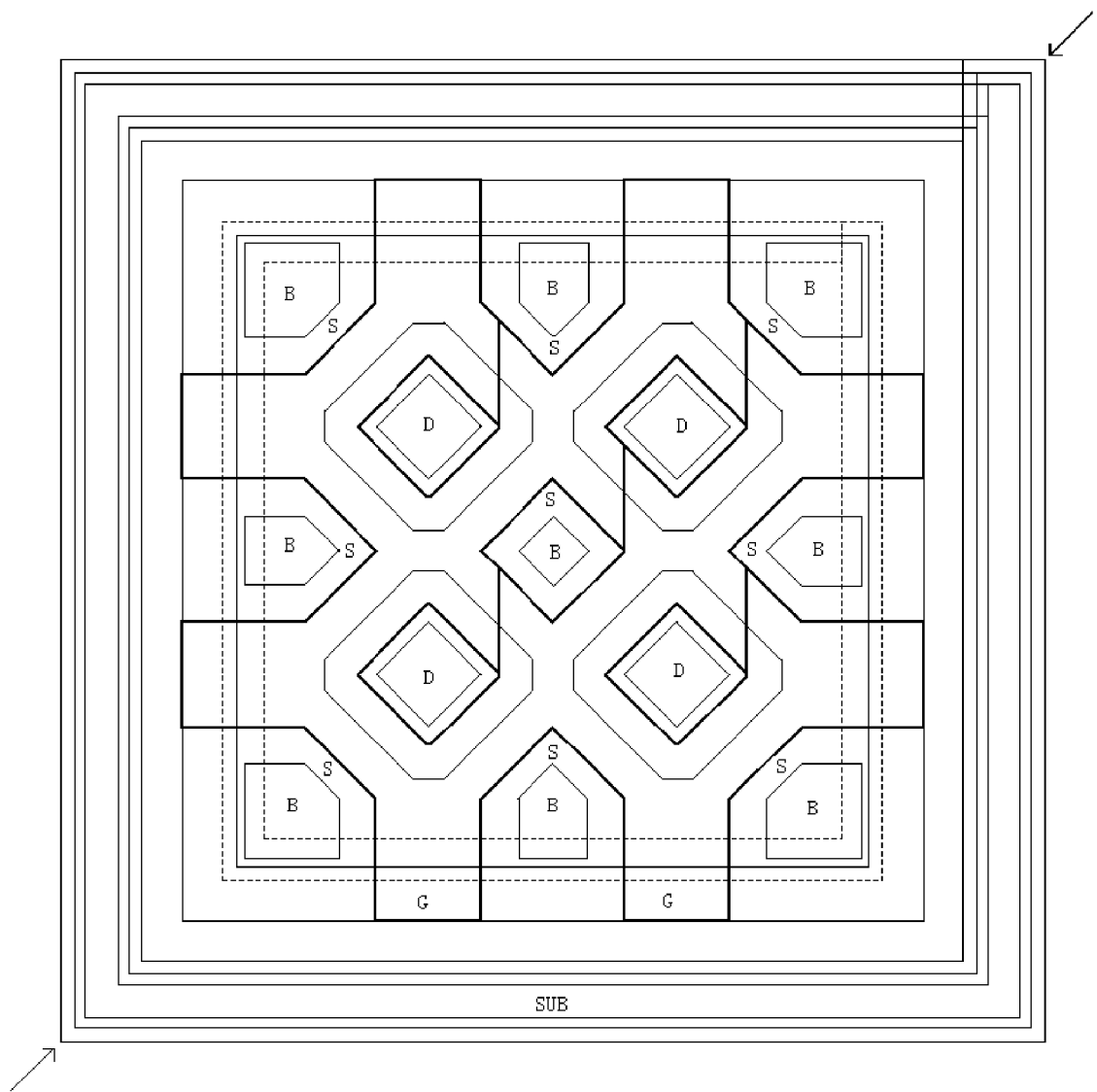
FIG. 1 is a plane diagram of a LDMOS structure according to a preferred embodiment of the present invention.

Referring to FIG. 1 of the drawings, a plane diagram of a Laterally Diffused Metal Oxide Semiconductor (LDMOS) structure according to a preferred embodiment of the present invention is illustrated, in which the LDMOS structure comprises a drain D, a source S, a gate G, a back gate B, and a P-type bulk PSUB. As shown in FIG. 1, the drain D has a plurality of drain regions; the source B has a plurality of source regions; the gate G has a plurality of gate regions; the back gate B has a plurality of back gate regions, wherein each source region is surrounded by four drain regions, each drain region is surrounded by four source regions, each gate region is located between a source region and a drain region, and each source region is located near a back gate region.

Figure 2:
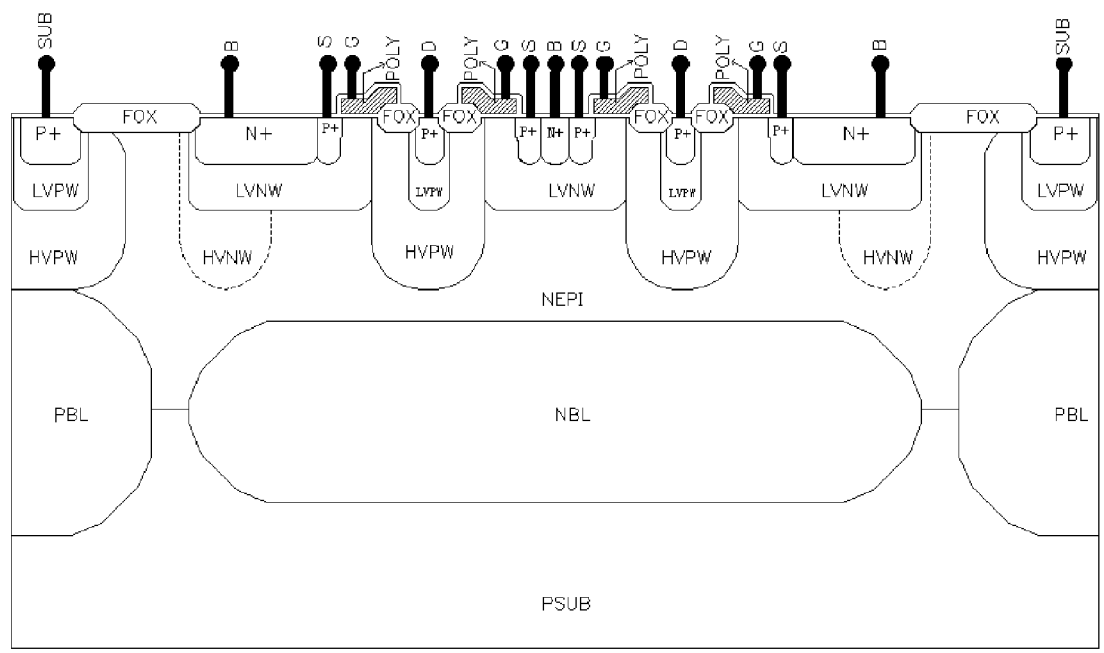
FIG. 2 is a sectional diagram of the LDMOS structure according to above preferred embodiment of the present invention.

Also, referring to FIG. 2, which shows a sectional diagram cut along a 45-degree diagonal of the FIG. 1, namely, along the direction shown by arrows. As shown in FIG. 2, the LDMOS structure comprises a field-oxide layer FOX, a P-implanted layer P+, a P-well layer LVPW, a deep P-well layer HVPW, a N-epitaxial layer NEPI, a N-implanted layer N+, a N-well layer LVNW, a deep N-well layer HVNW, a P-type buried layer PBL, a N-type buried layer NBL, a polycrystalline silicon layer POLY, the P-type bulk PSUB, the drain D, the source S, the gate G, the back gate B and a P-type bulk terminal SUB.

Here, the back gate B comprises the N-implanted layer N+, the N-well layer LVNW, the deep N-well layer HVNW, the N-epitaxial layer NEPI, and the N-type buried layer NBL, wherein the N-implanted layer N+ is next to the P-implanted layer P+, and the N-implanted layer N+ and the P-implanted layer P+ are both located within the N-well layer LVNW; the N-well layer LVNW is semi-enclosed by the deep N-well layer HVNW; the N-well layer LVNW and the deep N-well layer HVNW are both located within the N-epitaxial layer NEPI; the N-epitaxial layer NEPI is located on the N-type buried layer NBL; and the N-type buried layer NBL is located on the P-type bulk PSUB.

The source S comprises the P-implanted layer P+, wherein the P-implanted layer P+ is located within the N-well layer LVNW and next to the N-implanted layer N+.

The gate G comprises the polycrystalline silicon layer POLY, wherein the polycrystalline silicon layer POLY is located on the N-well layer LVNW.

The drain D comprises the P-implanted layer P+, the P-well layer LVPW, and the deep P-well layer HVPW, wherein the P-implanted layer P+ is located within the P-well layer LVPW, and the P-well layer LVPW is located within the deep P-well layer HVPW.

The P-type bulk terminal SUB is connected through the P-implanted layer P+, the P-well layer LVPW, the deep P-well layer HVPW, and the P-type buried layer PBL to the P-type bulk PSUN.

The field-oxide layer FOX is located below the polycrystalline silicon layer POLY.

The LDMOS structure of the present invention is designed based on N-epitaxial BiCMOS technology, in which a low-doped drift region is introduced between the channel and the drain region. When a high voltage is applied to the drain D, due to a lower concentration of the drift region, most of voltage is applied to the drift region, so that the LDMOS structure is able to withstand higher voltage. The LDMOS structure of the present invention provides the best epitaxial layer quality and the best length of the drift region, so it can get a minimum on-resistance with a certain source-drain breakdown voltage. Furthermore, the LDMOS structure is able to arrange the drain-source units in an array very closely, so as to obtain a smaller on-resistance. The FIG. 1 shows a net structure, in which there are four drain regions formed around a source region, and there are four source regions formed around a drain region. This structure is not prone to local avalanche breakdown. Also, the diagonal placement of the source region and the drain region can enhance the current limiting ability of the source and the drain, so as to improve the stabilities of above elements under extreme condition. Therefore, the combination of these advantages as described above makes the LDMOS structure is often employed on transient overload conditions.

The LDMOS structure of the present invention a novel structure based on BiCMOS technology, and it can be produced according to prior art methods without any extra masking step. Furthermore, it has compact structure, low on-resistance, and can withstand high current and high voltage.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A Laterally Diffused Metal Oxide Semiconductor (LDMOS) structure, comprising a gate, a source, a drain and a bulk, wherein the gate comprises a polycrystalline silicon layer, the source comprises a P-implanted layer, and the drain comprises the P-implanted layer, a P-well layer, and a deep P-well layer, wherein the P-implanted layer is located within the P-well layer, and the P-well layer is located within the deep P-well layer, wherein a bulk terminal is connected through the P-implanted layer, the P-well layer, the deep P-well layer, and a P-type buried layer to the bulk, wherein the drain has a plurality of drain regions, the source has a plurality of source regions, the gate has a plurality of gate regions, wherein each source region is surrounded by four drain regions, each drain region is surrounded by four source regions, and each gate region is located between a source region and a drain region.

2. The LDMOS structure, as recited in claim 1, further comprising a back gate having a plurality of back gate regions, and comprising a N-implanted layer, a N-well layer, a deep N-well layer, a N-epitaxial layer, and a N-type buried layer, wherein the N-implanted layer is next to the P-implanted layer, the N-implanted layer and the P-implanted layer are both located within the N-well layer, the N-well layer is semi-enclosed by the deep N-well layer, the N-well layer and the deep N-well layer are both located within the N-epitaxial layer, the N-epitaxial layer is located on the N-type buried layer, and the N-type buried layer is located on the bulk, wherein each source region is located near a back gate region.

3. The LDMOS structure, as recited in claim 2, further comprising a field-oxide layer located below the polycrystalline silicon layer.

4. The LDMOS structure, as recited in claim 3, wherein the bulk is a P-type bulk, the bulk terminal is a P-type bulk terminal.

5. The LDMOS structure, as recited in claim 4, wherein the LDMOS is a P-channel LDMOS.

6. The LDMOS structure, as recited in claim 3, wherein the LDMOS is a P-channel LDMOS.

7. The LDMOS structure, as recited in claim 2, wherein the bulk is a P-type bulk, the bulk terminal is a P-type bulk terminal.

8. The LDMOS structure, as recited in claim 7, wherein the LDMOS is a P-channel LDMOS.

9. The LDMOS structure, as recited in claim 2, wherein the LDMOS is a P-channel LDMOS.

10. The LDMOS structure, as recited in claim 1, wherein the bulk is a P-type bulk, the bulk terminal is a P-type bulk terminal.

11. The LDMOS structure, as recited in claim 1, wherein the LDMOS is a P-channel LDMOS.

* * * * *